US010460588B2

(12) United States Patent
Chi et al.

(10) Patent No.: US 10,460,588 B2
(45) Date of Patent: Oct. 29, 2019

(54) SYSTEMS AND METHODS FOR WIND TUNNEL OPERATION

(71) Applicant: The Boeing Company, Chicago, IL (US)

(72) Inventors: Raymond Sungtah Chi, Renton, WA (US); Russell William Waymire, Gig Harbor, WA (US)

(73) Assignee: THE BOEING COMPANY, Chicago, IL (US)

( * ) Notice: Subject to any disclaimer, the term of this patent is extended or adjusted under 35 U.S.C. 154(b) by 48 days.

(21) Appl. No.: 15/257,332

(22) Filed: Sep. 6, 2016

(65) Prior Publication Data
US 2018/0068551 A1   Mar. 8, 2018

(51) Int. Cl.
G01M 9/06 (2006.01)
G01M 9/08 (2006.01)
G08B 21/18 (2006.01)
G01M 9/02 (2006.01)
G06F 17/50 (2006.01)
H04Q 9/00 (2006.01)
(Continued)

(52) U.S. Cl.
CPC ......... *G08B 21/182* (2013.01); *G01M 5/0016* (2013.01); *G01M 5/0041* (2013.01); *G01M 5/0066* (2013.01); *G01M 9/02* (2013.01); *G06F 17/50* (2013.01); *H04Q 9/00* (2013.01); *H04L 67/12* (2013.01); *H04Q 2209/823* (2013.01)

(58) Field of Classification Search
None
See application file for complete search history.

(56) References Cited

U.S. PATENT DOCUMENTS

| 5,196,046 A | 3/1993 | Sharma |
| 8,200,442 B2 * | 6/2012 | Adams .................. G06Q 10/04 702/34 |
| 9,064,357 B1 | 6/2015 | McCormick |

(Continued)

FOREIGN PATENT DOCUMENTS

| CN | 105784318 A | 7/2016 |
| WO | 2015131193 A1 | 9/2015 |

OTHER PUBLICATIONS

Model Safety of Flight (M-SOF); V. 1.6.1 Operation Manual; 2016, 24 pp.

(Continued)

*Primary Examiner* — Muhammad N Edun
*Assistant Examiner* — Jerold B Murphy
(74) *Attorney, Agent, or Firm* — Armstrong Teasdale LLP

(57) ABSTRACT

A system for monitoring a model in a wind tunnel is provided. The system includes a plurality of sensors attached to a model in a wind tunnel. Each sensor of the plurality of sensors is configured to measure an attribute of the model. The system also includes a computing device in communication with the plurality of sensors. The computing device is programmed to receive a plurality of signals from the plurality of sensors, store a first threshold and a second threshold based on normalized alarm limits associated with at least one of the plurality of sensors, analyze the plurality of signals based, at least in part, on the first threshold and the second threshold, determine that a potentially negative condition is occurring based on the analysis, and alert a user to the potentially negative condition.

20 Claims, 8 Drawing Sheets

(51) Int. Cl.
*G01M 5/00* (2006.01)
*H04L 29/08* (2006.01)

(56) References Cited

U.S. PATENT DOCUMENTS

| | | | | |
|---|---|---|---|---|
| 9,221,557 | B1* | 12/2015 | Friesel | B64F 1/025 |
| 2003/0177825 | A1* | 9/2003 | Gibson | G01M 9/08 |
| | | | | 73/147 |
| 2005/0049803 | A1* | 3/2005 | Mangalam | G01M 9/06 |
| | | | | 702/45 |
| 2008/0004838 | A1* | 1/2008 | Yungkurth | G06Q 10/04 |
| | | | | 702/182 |
| 2009/0320582 | A1* | 12/2009 | Milde | G01M 9/06 |
| | | | | 73/147 |
| 2010/0132446 | A1* | 6/2010 | Corder | G01M 9/062 |
| | | | | 73/147 |
| 2011/0046926 | A1* | 2/2011 | Calmels | G01M 9/06 |
| | | | | 703/2 |
| 2015/0274314 | A1 | 10/2015 | Conrad | |
| 2017/0095742 | A1* | 4/2017 | Boyle | A63G 21/04 |

OTHER PUBLICATIONS

Extended European Search Report for related Application 17181720.8 dated Jan. 18, 2018, 8 pp.

* cited by examiner

SYSTEMS AND METHODS FOR WIND TUNNEL OPERATION

BACKGROUND

The field of the present disclosure relates generally to wind tunnel operation, and, more specifically, to monitoring and ensuring the safety of a model in a wind tunnel environment.

Aircraft are extensively tested throughout all stages of development. One type of testing is through the use of wind tunnels. In many cases, a scale model of the aircraft is placed on a frame in a wind tunnel and subjected to a variety of conditions. These conditions may cause catastrophic responses from the models. In some cases, these responses occur in less time than an operator can respond. In some of these cases, the catastrophic responses may cause significant damage to at least one of the model and the wind tunnel. Both the models and the wind tunnels are expensive. There is a need for a system for preventing damage to both the models and the wind tunnels during operation.

BRIEF DESCRIPTION

In one aspect, a system for monitoring a model in a wind tunnel is proved. The system includes a plurality of sensors attached to a model in a wind tunnel. Each sensor of the plurality of sensors is configured to measure an attribute of the model. The system also includes a computing device in communication with the plurality of sensors. The computing device includes a processor in communication with a memory. The computing device is programmed to receive a plurality of signals from the plurality of sensors. The plurality of signals represent measurements of the attributes of the model. The computing device is also programmed to store a first threshold and a second threshold based on normalized alarm limits associated with at least one of the plurality of sensors, analyze the plurality of signals based, at least in part, on the first threshold and the second threshold, determine that a potentially negative condition is occurring based on the analysis, and alert a user to the potentially negative condition.

In another aspect, a wind tunnel structural health monitor (WTSHM) computer device for monitoring a model in a wind tunnel is provided. The WTSHM computer device includes a processor in communication with a memory. The processor is programmed to receive a plurality of signals from a plurality of sensors. Each sensor of the plurality of sensors is configured to measure an attribute of a model in the wind tunnel. The plurality of signals represent measurements of the attributes of the model. The processor is also programmed to store a first threshold and a second threshold based on normalized alarm limits associated with at least one of the plurality of sensors, analyze the plurality of signals based, at least in part, on the first threshold and the second threshold, determine that a potentially negative condition is occurring based on the analysis, and alert a user to the potentially negative condition.

In yet another aspect, a method for monitoring a model in a wind tunnel is provided. The method is implemented using a wind tunnel structural health monitor (WTSHM) computer device. The WTSHM computer device includes a processor in communication with a memory. The method includes receiving a plurality of signals from a plurality of sensors. Each sensor of the plurality of sensors is configured to measure an attribute of a model in the wind tunnel. The plurality of signals represent measurements of the attributes of the model. The method also includes storing a first threshold and a second threshold based on normalized alarm limits associated with at least one of the plurality of sensors, analyzing the plurality of signals based, at least in part, on the first threshold and the second threshold, determining that a potentially negative condition is occurring based on the analysis, and alerting a user to the potentially negative condition.

DETAILED DESCRIPTION

Figure 1:
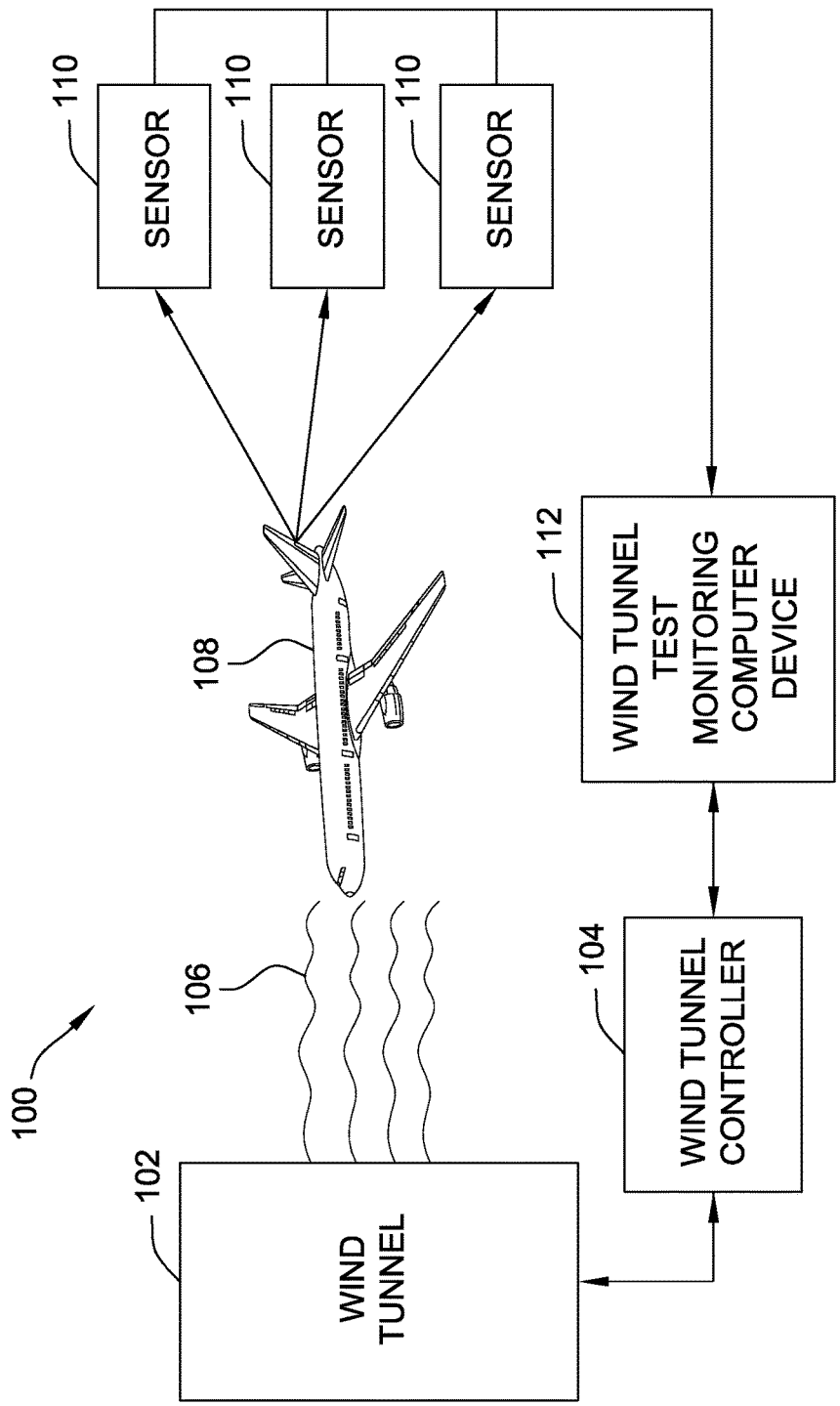
FIG. 1 illustrates a block diagram of an example overview of a wind tunnel environment in accordance with one embodiment of the present disclosure.

The implementations described herein relate to systems and methods for wind tunnel operation, and, more specifically, to monitoring and ensuring the safety of a model in a wind tunnel environment. More specifically, a wind tunnel structural health monitor ("WTSHM") computer device (also known as a WTSHM server), provides a communication interface between a plurality of sensors attached to an aircraft model in a wind tunnel and the wind tunnel itself. The WTSHM computer device analyzes the conditions monitored by the sensor, determines when a potentially negative condition occurs, alerts a user of the potentially negative condition, and potentially modifies the operation of the wind tunnel in response to the potentially negative condition.

In the example embodiment, the WTSHM server receives a plurality of signals from a plurality of sensors attached to an aircraft model in a wind tunnel. The plurality of signals represents data about attributes of the aircraft model based on the conditions in the wind tunnel. The WTSHM server stores a first threshold and a second threshold. In the example embodiment, the first threshold is a warning threshold and the second threshold is an alert threshold. In the example embodiment, the warning threshold and the alert threshold are set by a user. In the example embodiment, the alert threshold is at 100% and the warning threshold is below 100% and varies based on the channel.

In the example embodiment, the WTSHM server analyzes the plurality of signals based on the warning threshold and the alert threshold. The WTSHM server determines that a potentially negative condition is occurring based on the analysis. The WTSHM server alerts the user to the potentially negative condition.

In the example embodiment, the WTSHM server analyzes the plurality of signals in comparison to the warning threshold and the alert threshold. In the example embodiment, the WTSHM server normalizes the sensor data for each channel into a percentage based on preset alarm values. In some embodiments, a channel represents a single sensor. In other embodiments, a channel may represent a plurality of sensors. For example, the WTSHM server may receive sensor data from three strain sensors on the left wing of the aircraft model. The WTSHM server may combine and preprocess the data from the three sensors into channel A. The WTSHM server compares channel A to the warning threshold and the alert threshold. For example, if the combined sensor data in channel A is below both thresholds, the WTSHM server does not trigger an alarm and continues to monitor the channel.

In the case of channel B where the warning threshold is at 60%, the WTSHM server determines that the normalized output of channel B is over 60% which is over warning threshold for that channel. The WTSHM server alerts a user by initiating a short alarm. The alarm may be at least one of a visual alarm, such as a flash of color on display screen, and a short audible alarm, such as a squawk or blat sound.

If the WTSHM server determines that the warning threshold for channel B has been exceeded a predetermined number of times in a predetermined period of time, such as three times in 0.5 seconds, the WTSHM server initiates a warning alarm. The warning alarm includes at least one of a visual alarm and an audible alarm. In the example embodiment, the predetermined number and predetermined period of time are set by the user. The WTSHM server stores the plurality of signals received from the sensor(s) associated with channel B for a predetermined period of time before and after the warning alarm was initiated. This predetermined period of time may be stored as delay data. In the some embodiments, the WTSHM server receives a plurality of signals and the plurality of signals include a large amount of data. To save storage space, the WTSHM server stores the data from the signals in a circular buffer such that old data is written over after a period of time. This period of time may be based on the predetermined period of time. For example, where the WTSHM server stores 5 seconds of data before and after an alarm was triggered, the circular buffer may contain 13 seconds of data at a time to ensure that the needed data has been stored. In the example embodiment, the WTSHM server stores the plurality of signals in a database, where the database is located remotely from the WTSHM server. The WTSHM server further stores the plurality of signals with a warning tag for future analysis. In some embodiments, the WTSHM server also stores the tunnel conditions, the power spectral density of channels, and any bookmarks associated with the power spectral density for the time before and after the alarm was triggered.

The WTSHM server also initiates a warning alarm if the WTSHM server determines that the warning threshold has been exceeded by at least half of the distance between the warning threshold and the alert threshold. For example, if a channel has the warning threshold at 60% and the alert threshold is at 100%, a warning alarm would be initiated if the channel output reaches or exceeds 80%.

When the WTSHM server determines that the alert threshold has been exceeded, the WTSHM server initiates an alert alarm. The alert alarm includes at least one of a visual alarm and an audible alarm. In the example embodiment, the predetermined number and predetermined period of time are set by the user. The WTSHM server stores the plurality of signals received from the sensor(s) associated with the channel for a predetermined period of time before and after the alert alarm was initiated. In the example embodiment, the WTSHM server stores the plurality of signals in the database. The WTSHM server further stores the plurality of signals with an alert tag for future analysis. In the example embodiment, the WTSHM server transmits one or more messages to a wind tunnel controller which controls the operation of the wind tunnel. The one or more messages include instructions to change the conditions being generated by the wind tunnel. The one or more messages are configured to reverse one or more conditions that are affecting aircraft model 108 in such a way that an alert alarm was issued. In some embodiments, the one or more messages instruct the wind tunnel controller to shut down or deactivate wind tunnel.

In some embodiments, the WTSHM server includes a low-pass or band-pass filter to filter the plurality of signals received from the plurality of sensors. In these embodiments, the signals are filtered before the WTSHM server analyzes the plurality of signals. However, when the WTSHM server stores data in response to a warning alarm or alert alarm, the WTSHM server stores the unfiltered sensor data.

In some further embodiments, the WTSHM server combines the data from a plurality of channels to compare to the warning and alert thresholds. For example, the WTSHM server may also combine the data from channels A, B, and C to trigger one or more alarms, where the data from each of the channels is below the warning threshold. In still further embodiments, the WTSHM server may only monitor combinations of channels for triggering alarms, instead of individual channels.

In some embodiments, the WTSHM server compares the combined channels to a factor of safety. The factor of safety represents a buffer of operation before the model is expected to fail. In these embodiments, the WTSHM server may receive the factor of safety from the user. For example, the user may determine that the model will fail at a certain point. The user sets the factor of safety to allow the WTSHM server to shut down or change operation of the wind tunnel before the model fails.

Described herein are computer systems such as the WTSHM computer devices and related computer systems. As described herein, all such computer systems include a processor and a memory. However, any processor in a computer device referred to herein may also refer to one or more processors wherein the processor may be in one computing device or a plurality of computing devices acting in parallel. Additionally, any memory in a computer device referred to herein may also refer to one or more memories wherein the memories may be in one computing device or a plurality of computing devices acting in parallel.

As used herein, a processor may include any programmable system including systems using micro-controllers, reduced instruction set circuits (RISC), application specific integrated circuits (ASICs), logic circuits, and any other circuit or processor capable of executing the functions described herein. The above examples are not intended to limit in any way the definition and/or meaning of the term "processor."

As used herein, the term "database" may refer to either a body of data, a relational database management system (RDBMS), or to both. As used herein, a database may include any collection of data including hierarchical databases, relational databases, flat file databases, object-relational databases, object oriented databases, and any other structured collection of records or data that is stored in a computer system. The above examples are not intended to limit in any way the definition and/or meaning of the term database. Examples of RDBMS's include, but are not limited to including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, Calif.; IBM is a registered trademark of International Business Machines Corporation, Armonk, N.Y.; Microsoft is a registered trademark of Microsoft Corporation, Redmond, Wash.; and Sybase is a registered trademark of Sybase, Dublin, Calif.)

In one embodiment, a computer program is provided, and the program is embodied on a computer readable medium. In an example embodiment, the system is executed on a single computer system, without requiring a connection to a server computer. In a further embodiment, the system is being run in a Windows® environment (Windows is a registered trademark of Microsoft Corporation, Redmond, Wash.). In yet another embodiment, the system is run on a mainframe environment and a UNIX® server environment (UNIX is a registered trademark of X/Open Company Limited located in Reading, Berkshire, United Kingdom). The application is flexible and designed to run in various different environments without compromising any major functionality. In some embodiments, the system includes multiple components distributed among a plurality of computing devices. One or more components may be in the form of computer-executable instructions embodied in a computer-readable medium.

As used herein, an element or step recited in the singular and preceded with the word "a" or "an" should be understood as not excluding plural elements or steps, unless such exclusion is explicitly recited. Furthermore, references to "example embodiment" or "one embodiment" of the present disclosure are not intended to be interpreted as excluding the existence of additional embodiments that also incorporate the recited features.

As used herein, the terms "software" and "firmware" are interchangeable, and include any computer program stored in memory for execution by a processor, including RAM memory, ROM memory, EPROM memory, EEPROM memory, and non-volatile RAM (NVRAM) memory. The above memory types are example only, and are thus not limiting as to the types of memory usable for storage of a computer program.

Furthermore, as used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

The systems and processes are not limited to the specific embodiments described herein. In addition, components of each system and each process can be practiced independent and separate from other components and processes described herein. Each component and process also can be used in combination with other assembly packages and processes.

FIG. 1 illustrates a block diagram of an example overview of a wind tunnel environment 100 in accordance with one embodiment of the present disclosure. Wind tunnel environment 100 includes a wind tunnel 102 that generates a plurality of plurality of conditions 106. The plurality of conditions 106 simulates various flight conditions that an aircraft may encounter to determine the effect of these conditions on an aircraft. In the example embodiment, wind tunnel 102 is controlled by a wind tunnel controller 104, which receives commands from a user (not shown). In some embodiments, wind tunnel 102 provides feedback information to wind tunnel controller 104 about the plurality of conditions 106 in wind tunnel environment 100.

In the example embodiment, wind tunnel environment 100 also includes an aircraft model 108 that is being tested. In some embodiments, aircraft model 108 is a full size aircraft. In other embodiments, aircraft model 108 is a scale model of the aircraft to be tested. In still other embodiments, aircraft model 108 is one or more parts of an aircraft that are being tested. In the example embodiment, aircraft model 108 is securely fastened to a mount (not shown) for testing to ensure that aircraft model 108 does not move from the desired location in wind tunnel environment 100. An insecurely mounted aircraft model 108 may break free from the mount during severe conditions or may allow for variations to be introduced into in test results, where the variations are based on interactions between aircraft model 108 and the mount. In the example embodiment, plurality of conditions 106 exerts various forces on aircraft model 108. This plurality of conditions 106 are designed to simulate forces or conditions that would or could be exerted on the aircraft represented by aircraft model 108.

In the example embodiment, aircraft model 108 is attached to a plurality of sensors 110. Each of these sensors 110 measures one or more attributes of aircraft 108 and the change in these attributes is based on the plurality of conditions 106 that aircraft model 108 is experiencing. Plurality of sensors 110 may include, but are not limited to, signal conditioners and transducers, such as strain gauges, and accelerometers. Plurality of sensors 110 may measure strain or stress on aircraft model 108, lift, weight, drag, and thrust at various points on aircraft model 108, and other attributes of aircraft model as needed to test aircraft model 108.

In the example embodiment, plurality of sensors 110 provides signals to a wind tunnel structural health monitor ("WTSHM") computer device 112, also known as a WTSHM server 112. The signals represent the measured values of the attributes associated with each sensor 110.

In some embodiments, WTSHM computer device 112 is in communication with wind tunnel controller 104. In these embodiments, wind tunnel controller 104 is configured to transmit information to other computer devices, such as WTSHM computer device 112, about wind tunnel 102 and plurality of conditions 106 that wind tunnel 102 is generating. In some of these environments, WTSHM computer device 112 is configured to transmit commands to wind tunnel controller 104 to alter the operation of wind tunnel 102, which may change the conditions 106 that are being exerted on aircraft model 108.

Figure 2:
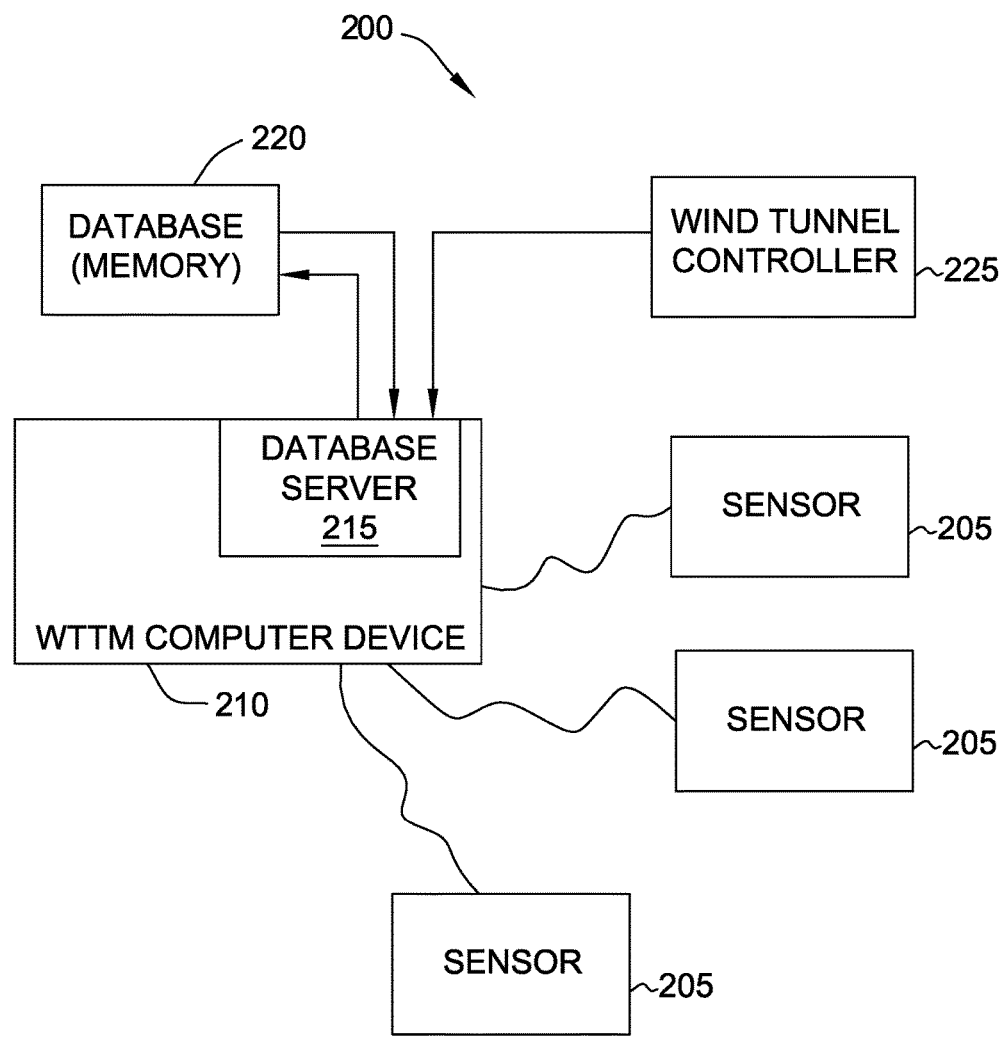
FIG. 2 is a simplified block diagram of an example system for monitoring a model in the wind tunnel environment shown in FIG. 1.

FIG. 2 is a simplified block diagram of an example system 200 for monitoring a model 108 (shown in FIG. 1) in wind tunnel environment 100 shown in FIG. 1. In the example embodiment, system 200 is used for monitoring conditions 106 in wind tunnel 102 (both shown in FIG. 1), analyzing attributes of aircraft model 108 based on those conditions 106, and determining if negative conditions are occurring that may be potentially dangerous. In addition, system 200 is a monitoring system that includes a wind tunnel structural health monitor (WTSHM) computer device 210 (also known as a WTSHM server) configured to monitor aircraft model 108. As described below in more detail, WTSHM server 210 is configured to receive a plurality of signals from a plurality of sensors 205. Each sensor 205 of the plurality of sensors 205 is configured to measure an attribute of model 108 in wind tunnel 102. The plurality of signals represents measurements of the attributes of model 108. WTSHM server 210 is also configured to store a first threshold and a second threshold. The first threshold is between the second threshold and normal operation. WTSHM server 210 is further configured to analyze the plurality of signals based, at least in part, on the first threshold and the second threshold, determine that a potentially negative condition is occurring based on the analysis, and alert a user to the potentially negative condition.

In the example embodiment, sensors 205 measure attributes of aircraft model 108, similar to sensors 110, shown in FIG. 1. In the example embodiment, sensors 205 are communicatively coupled to WTSHM server 210 through many interfaces including, but not limited to, at least one of a network, such as the Internet, a LAN, a WAN, or an integrated services digital network (ISDN), a dial-up-connection, a digital subscriber line (DSL), a cellular phone connection, a satellite connection, and a cable modem. Sensor 205 can be any device capable of measuring one or more attributes of aircraft model 108, such as, but not limited to, strain or stress on aircraft model 108, lift, weight, drag, and thrust at various points on aircraft model 108, and other attributes of aircraft model as needed to test aircraft model 108.

A database server 215 is communicatively coupled to a database 220 that stores data. In one embodiment, database 220 is a database that includes thresholds, sensor data, warning data, and alert data. In the example embodiment, database 220 is stored remotely from WTSHM server 210. In some embodiments, database 220 is decentralized. In some embodiments, database 220 is centralized. In the example embodiment, a user can access database 220 via a client system (not shown) by logging onto WTSHM server 210. In some embodiments, database 220 includes a single database having separated sections or partitions or in other embodiments, database 220 includes multiple databases, each being separate from each other. Database 220 stores condition data received from multiple sensors 205. In addition, database 220 stores thresholds, warning data, alert data, and delay data generated as part of collecting condition data from multiple sensors 205.

In the example embodiment, WTSHM server 210 receives and analyzes data about the operation of wind tunnel 102 and conditions 106 as they affect aircraft model 108. This data could include data from sensors 205, current conditions 106 generated by wind tunnel 102, and other operational data that WTSHM server 210 could monitor. Furthermore, WTSHM server 210 accesses database 220. In some embodiments, WTSHM server 210 includes a display unit (not shown) to present the data from wind tunnel environment 100 to a user (not shown). In some embodiments, WTSHM server 210 is communicatively coupled to the Internet through many interfaces including, but not limited to, at least one of a network, such as the Internet, a LAN, a WAN, or an integrated services digital network (ISDN), a dial-up-connection, a digital subscriber line (DSL), a cellular phone connection, a satellite connection, and a cable modem. WTSHM server 210 can be any device capable of accessing a network, such as the Internet, including, but not limited to, a desktop computer, a laptop computer, a personal digital assistant (PDA), a cellular phone, a smartphone, a tablet, a phablet, or other web-based connectable equipment. In some embodiments, WTSHM server 210 includes a low-pass filter (not shown) that filters sensor data.

In the example embodiment, WTSHM server 210 is also in communication with wind tunnel controller 225, which may be similar to wind tunnel controller 104 shown in FIG. 1. In the example embodiment, wind tunnel controller 225 is configured to communicate with and control wind tunnel 102. Wind tunnel controller 225 is configured to communicate with WTSHM server 210 via using the Internet. In some embodiments, wind tunnel controller 225 is communicatively coupled to the Internet through many interfaces including, but not limited to, at least one of a network, such as the Internet, a LAN, a WAN, or an integrated services digital network (ISDN), a dial-up-connection, a digital subscriber line (DSL), a cellular phone connection, a satellite connection, and a cable modem. Wind tunnel controller 225 can be any device capable of accessing a network, such as the Internet, including, but not limited to, a desktop computer, a laptop computer, a personal digital assistant (PDA), a cellular phone, a smartphone, a tablet, a phablet, or other web-based connectable equipment.

Figure 3:
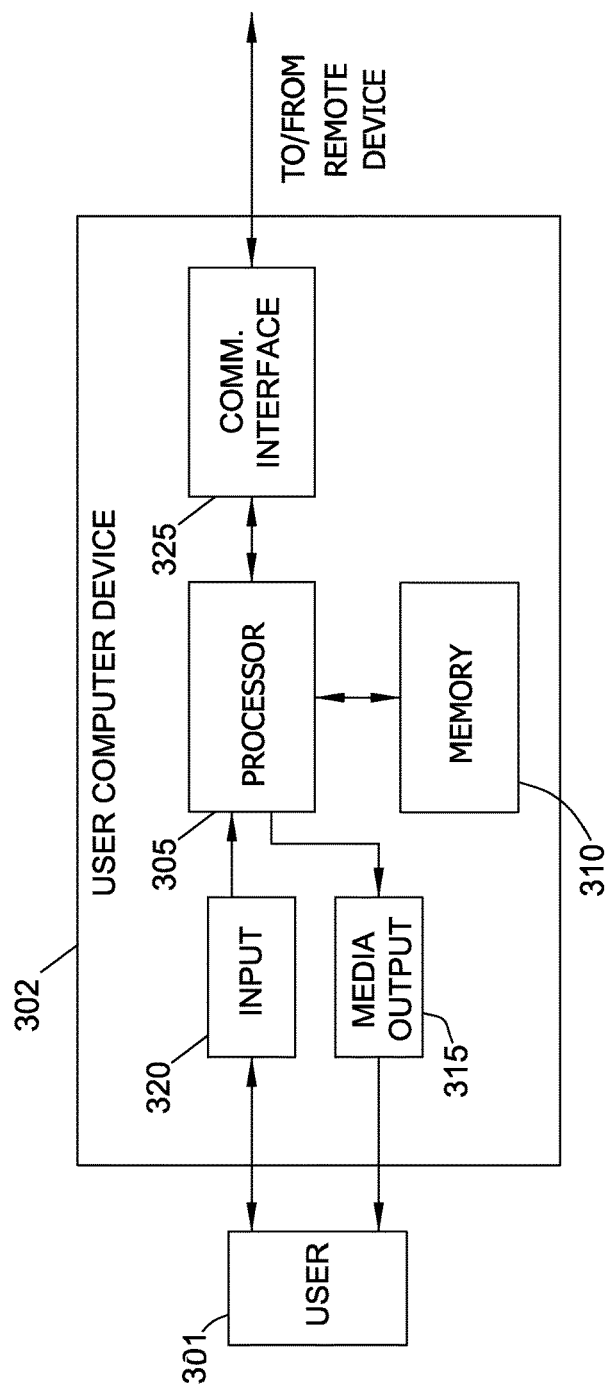
FIG. 3 illustrates an example configuration of a client computer device shown in FIG. 2, in accordance with one embodiment of the present disclosure.

FIG. 3 illustrates an example configuration of a client system, in accordance with one embodiment of the present disclosure. User computer device 302 is operated by a user 301. User computer device 302 may include, but is not limited to, wind tunnel controller 225 (shown in FIG. 2). User computer device 302 includes a processor 305 for executing instructions. In some embodiments, executable instructions are stored in a memory 310. Processor 305 may include one or more processing units (e.g., in a multi-core configuration). Memory area 310 is any device allowing information such as executable instructions and/or transaction data to be stored and retrieved. Memory area 310 may include one or more computer readable media.

User computer device 302 also includes at least one media output component 315 for presenting information to user 301. Media output component 315 is any component capable of conveying information to user 301. In some embodiments, media output component 315 includes an output adapter (not shown) such as a video adapter and/or an audio adapter. An output adapter is operatively coupled to processor 305 and operatively coupleable to an output device such as a display device (e.g., a cathode ray tube (CRT), liquid crystal display (LCD), light emitting diode (LED) display, or "electronic ink" display) or an audio output device (e.g., a speaker or headphones). In some embodiments, media output component 315 is configured to present a graphical user interface (e.g., a web browser and/or a client application) to user 301. In some embodiments, user computer device 302 includes an input device 320 for receiving input from user 301. Input device 320 may include, for example, a keyboard, a pointing device, a mouse, a stylus, a touch sensitive panel (e.g., a touch pad or a touch screen), a gyroscope, an accelerometer, a position detector, a biometric input device, and/or an audio input device. A single component such as a touch screen may function as both an output device of media output component 315 and input device 320.

User computer device 302 may also include a communication interface 325, communicatively coupled to a remote device such as WTSHM server 210 (shown in FIG. 2). Communication interface 325 may also be in communication with wind tunnel 102 shown in FIG. 1, where user computer device 302 provides instructions to and receives data from the wind tunnel 102. Communication interface 325 may include, for example, a wired or wireless network adapter and/or a wireless data transceiver for use with a mobile telecommunications network.

Stored in memory area 310 are, for example, computer readable instructions for providing a user interface to user 301 via media output component 315 and, optionally, receiving and processing input from input device 320. A user interface may include, among other possibilities, a web browser and/or a client application. Web browsers enable users, such as user 301, to display and interact with media and other information typically embedded on a web page or a website from WTSHM server 210. A client application allows user 301 to interact with, for example, WTSHM server 210. For example, instructions may be stored by a cloud service, and the output of the execution of the instructions sent to the media output component 315.

Processor 305 executes computer-executable instructions for implementing aspects of the disclosure. In some embodiments, the processor 305 is transformed into a special purpose microprocessor by executing computer-executable instructions or by otherwise being programmed.

Figure 4:
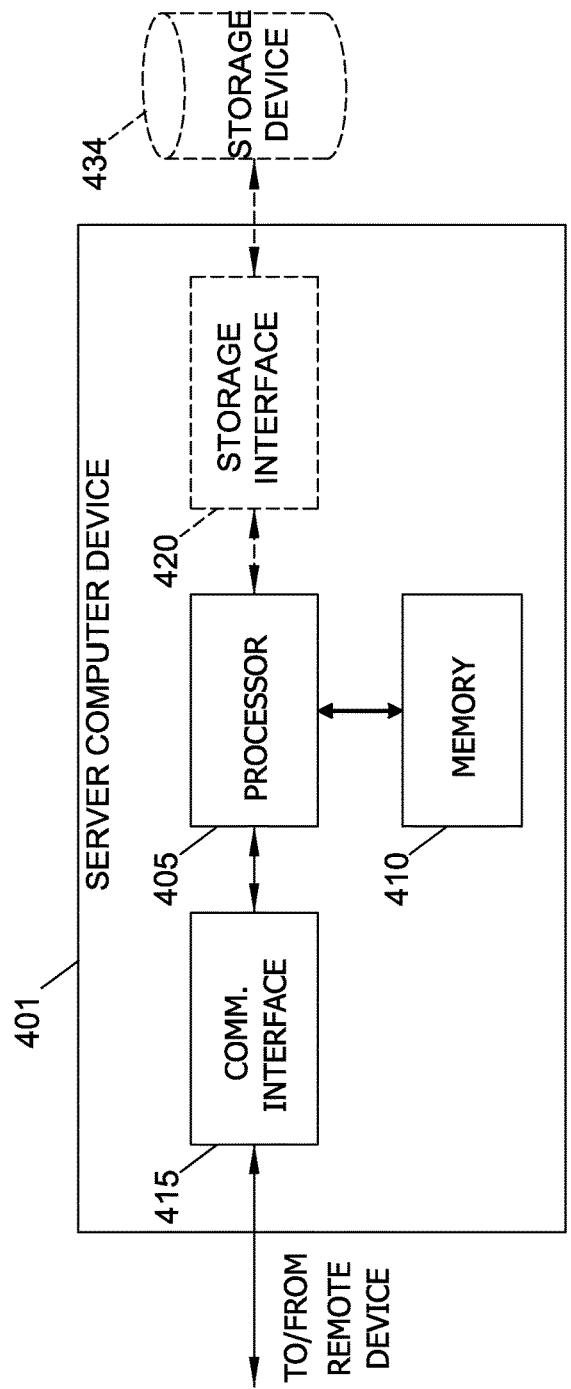
FIG. 4 illustrates an example configuration of the server system shown in FIG. 2, in accordance with one embodiment of the present disclosure.

FIG. 4 illustrates an example configuration of server system 210 shown in FIG. 2, in accordance with one embodiment of the present disclosure. Server computer device 401 may include, but is not limited to, database server 215, WTSHM server 210, and wind tunnel controller 225 (all shown in FIG. 2). Server computer device 401 also includes a processor 405 for executing instructions. Instructions may be stored in a memory area 410. Processor 405 may include one or more processing units (e.g., in a multi-core configuration).

Processor 405 is operatively coupled to a communication interface 415 such that server computer device 401 is capable of communicating with a remote device such as another server computer device 401, another WTSHM server 210, wind tunnel controller 225, client system (not shown), or wind tunnel 102 (shown in FIG. 2). For example, communication interface 415 may receive requests from wind tunnel controller 225 via the Internet, as illustrated in FIG. 2.

Processor 405 may also be operatively coupled to a storage device 434. Storage device 434 is any computer-operated hardware suitable for storing and/or retrieving data, such as, but not limited to, data associated with database 220 (shown in FIG. 2). In some embodiments, storage device 434 is integrated in server computer device 401. For example, server computer device 401 may include one or more hard disk drives as storage device 434. In other embodiments, storage device 434 is external to server computer device 401 and may be accessed by a plurality of server computer devices 401. For example, storage device 434 may include a storage area network (SAN), a network attached storage (NAS) system, and/or multiple storage units such as hard disks and/or solid state disks in a redundant array of inexpensive disks (RAID) configuration.

In some embodiments, processor 405 is operatively coupled to storage device 434 via a storage interface 420. Storage interface 420 is any component capable of providing processor 405 with access to storage device 434. Storage interface 420 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 405 with access to storage device 434.

Figure 6:
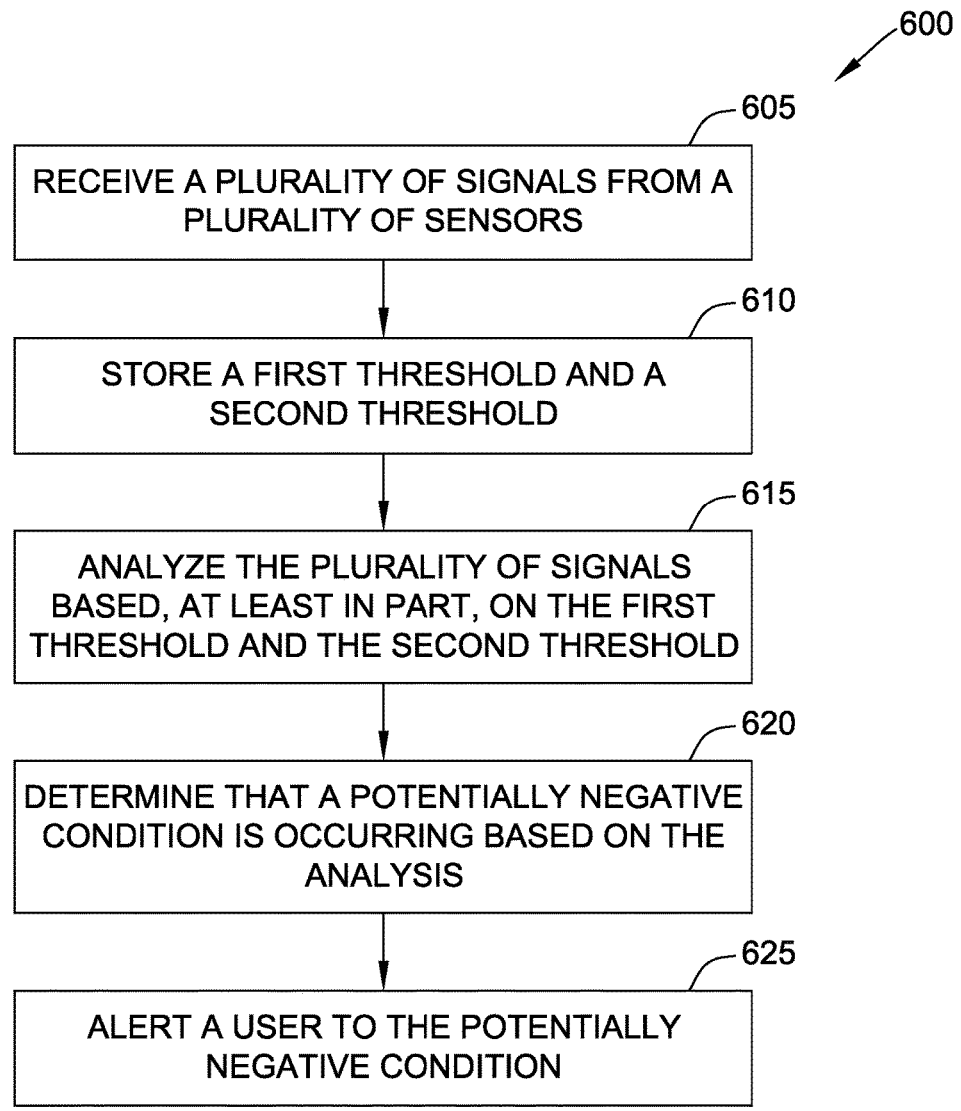
FIG. 6 is a flowchart illustrating an example of a process of monitoring a model in the wind tunnel environment shown in FIG. 1 using the system shown in FIG. 2.

Processor 405 executes computer-executable instructions for implementing aspects of the disclosure. In some embodiments, the processor 405 is transformed into a special purpose microprocessor by executing computer-executable instructions or by otherwise being programmed. For example, the processor 405 is programmed with the instructions such as illustrated in FIG. 6.

Figure 5:
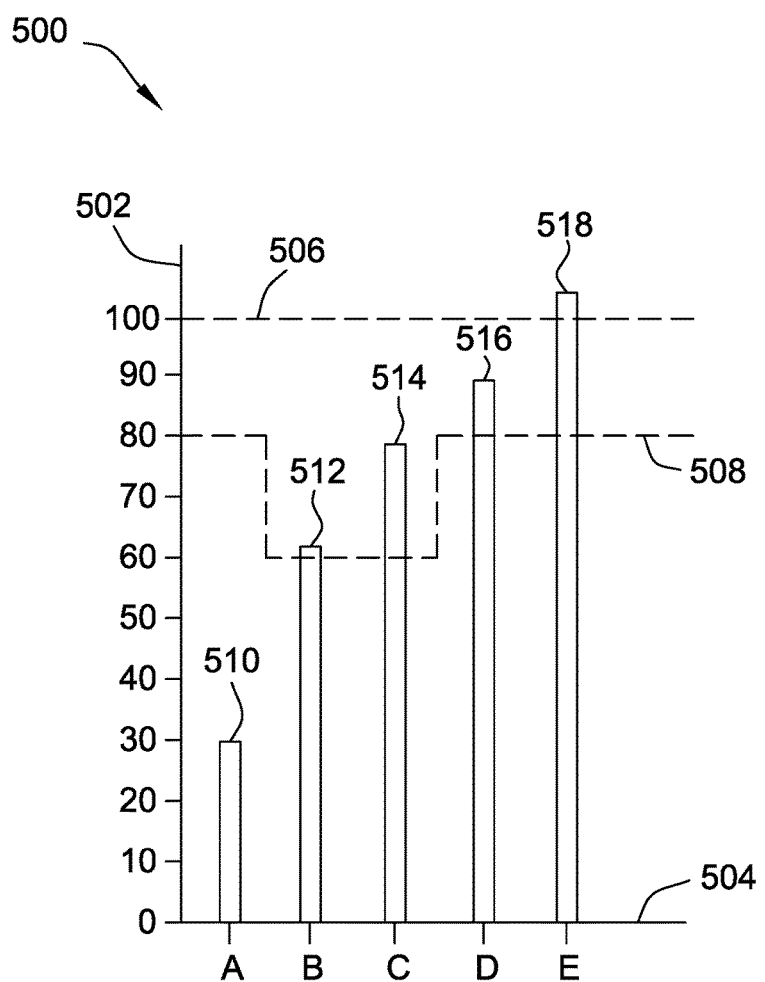
FIG. 5 illustrates an example graph of monitored sensor data from the system shown in FIG. 2 during operation of the wind tunnel environment shown in FIG. 1.

FIG. 5 illustrates an example graph 500 of monitored sensor data from system 200 shown in FIG. 2 during operation of wind tunnel environment 100 shown in FIG. 1. Graph 500 includes a y-axis 502 that represents a percentage of normalized alarm limits based on calculated alarm conditions and an x-axis 504 that represents the different channels of sensor inputs.

In the example embodiment, sensors 205 (shown in FIG. 2) measure a plurality of sensor data about aircraft model 108 (shown in FIG. 1). Sensors 205 transmit the plurality of sensor data to WTSHM server 210 (shown in FIG. 2). WTSHM server 210 divides the sensor data up based on sensor type, type of data, location on aircraft model 108, and any other division determined by the user. In some embodiments, sensor data from more than one sensor 205 may be combined into the same channel.

WTSHM server 210 analyzes and normalizes the sensor data to determine how close the sensor data is to the alarm limits. Y-axis 502 represents the normalized alarm limits, shown here as percentages, where 0 is normal operation and 100% is the level of the highest alarm, shown by line 506. In the example embodiment, sensor data is normalized into a percentage of alert threshold 506 (also known as alarm threshold). Graph 500 also includes warning threshold 508, which is at a lower percentage. As shown in FIG. 5, warning threshold 508 changes based on the channel. In other embodiments, alert threshold 506 changes based on the channel. In addition, channel A 510 and channel B 512 may be based on different data types; therefore, the same percentage may mean different sensor values have been received from the appropriate sensors 205 for the different channels.

As shown in graph 500, channel A 510 is operating at 30%. Since warning threshold 508 for channel A 510 is 80%, then no alarms are triggered. Channel B 512 is operating at 60%, since warning threshold 508 is 60%, then an alarm is triggered. Channel C 514 and Channel D 516 are also operating over their respective warning thresholds 508, but below their alert threshold 506. Furthermore, Channels C 514 and D 516 are halfway between their respective warning thresholds 508 and the alert threshold 506. Channel E 518 exceeds alert threshold 506.

In the example embodiment, alert threshold 506 and warning threshold 508 percentages are determined by the user. In this embodiment, the user enters numerical values for alert threshold 506 and warning threshold 508 through a computer device such as WTSHM server 210 or a user computer device (not shown) in communication with WTSHM server 210. In some embodiments, alert threshold 506 may be adjusted above or below 100%.

FIG. 6 is a flowchart illustrating an example of a process 600 of monitoring a model 108 in the wind tunnel environment 100 (both shown in FIG. 1) using system 200 shown in FIG. 2. Process 600 may be implemented by a computing device, for example WTSHM server 210 (shown in FIG. 2).

In the example embodiment, WTSHM server 210 receives 605 a plurality of signals from a plurality of sensors 205 (shown in FIG. 2). The plurality of signals represents data about attributes of aircraft model 108 (shown in FIG. 1). WTSHM server 210 stores 610 a first threshold and a second threshold. In the example embodiment, the first threshold is warning threshold 508 (shown in FIG. 5) and the second threshold is alert threshold 506 (shown in FIG. 5). In the example embodiment, warning threshold 508 and alert threshold 506 are set by a user.

In the example embodiment, WTSHM server 210 analyzes 615 the plurality of signals based on the warning threshold 508 and the alert threshold 506. WTSHM server 210 determines 620 that a potentially negative condition is occurring based on the analysis. WTSHM server 210 alerts 625 the user to the potentially negative condition.

In the example embodiment, WTSHM server 210 analyzes 615 the plurality of signals in comparison to warning threshold 508 and alert threshold 506. In the example embodiment, WTSHM server 210 normalizes the sensor data for each channel. In some embodiments, a channel represents a single sensor. In other embodiments, a channel may represent a plurality of sensors. For example, WTSHM server 210 may receive sensor data from three strain sensors 205 on the left wing of aircraft model 108. WTSHM server 210 may combine and preprocess the data from the three sensors 205 into channel A 510 (shown in FIG. 5). WTSHM server 210 compares channel A 510 to warning threshold 508 and alert threshold 506. Since in FIG. 5, channel A 510 is at 30%, which is below both thresholds, WTSHM server 210 does not trigger an alarm and continues to monitor the channel.

In the case of channel B 512 (shown in FIG. 5), WTSHM server 210 determines that the normalized output of channel B 512 is over 60% which is over warning threshold 508 for channel B 512. WTSHM server 210 alerts 625 a user by initiating a short alarm. The alarm may be at least one of a visual alarm, such as a flash of color on display screen, and a short audible alarm, such as a squawk or blat sound.

If WTSHM server 210 determines that warning threshold 508 for channel B 512 has been exceeded a predetermined number of times in a predetermined period of time, such as three times in 0.5 seconds, WTSHM server 210 initiates a warning alarm. The warning alarm includes at least one of a visual alarm and an audible alarm. In the example embodiment, the predetermined number and predetermined period of time are set by the user. WTSHM server 210 stores the plurality of signals received from the sensor(s) 205 associated with channel B 512 for a predetermined period of time before and after the warning alarm was initiated. This predetermined period of time may be stored as delay data. In the some embodiments, WTSHM server 210 received a plurality of signals and the plurality of signals include a large amount of data. To save storage space, WTSHM server 210 stores the data from the signals in a circular buffer such that old data is written over after a period of time. This period of time may be based on the predetermined period of time. For example, where WTSHM server 210 stores 5 seconds of data before and after an alarm was triggered, the circular buffer may contain 13 seconds of data at a time to ensure that that the needed data is stored. In the example embodiment, WTSHM server 210 stores the plurality of signals in database 220 (shown in FIG. 2), where database 220 is located remotely from WTSHM server 210. WTSHM server 210 further stores the plurality of signals with a warning tag for future analysis. In some embodiments, WTSHM server 210 also stores the tunnel conditions 106 (shown in FIG. 1), the power spectral density of channels, and any bookmarks associated with the power spectral density for the time before and after the alarm was triggered.

WTSHM server 210 also initiates a warning alarm if WTSHM server 210 determines that warning threshold 508 has been exceeded by at least half of the distance between warning threshold 508 and alert threshold 506. This is illustrated in FIG. 5, in both channel C 514 and channel D 516. Channel C 514 is at 80%, which is halfway between warning threshold 508 at 60% and alert threshold 506 at 100%. Channel D 516 is at 90% with a warning threshold 508 of 90% and alert threshold 506 at 100%.

When WTSHM server 210 determines that the alert threshold 506 has been exceeded, as is illustrated in channel E 518 (shown in FIG. 5), WTSHM server 210 initiates an alert alarm. The alert alarm includes at least one of a visual alarm and an audible alarm. In the example embodiment, the predetermined number and predetermined period of time are set by the user. WTSHM server 210 stores the plurality of signals received from the sensor(s) 205 associated with channel E 518 for a predetermined period of time before and after the alert alarm was initiated. In the example embodiment, WTSHM server 210 stores the plurality of signals in database 220 (shown in FIG. 2). WTSHM server 210 further stores the plurality of signals with an alert tag for future analysis. In the example embodiment, WTSHM server 210 transmits one or more messages to wind tunnel controller 225 (shown in FIG. 2). The one or more messages include instructions to change the conditions 106 being generated by wind tunnel 102 (both shown in FIG. 1). The one or more messages are configured to reverse one or more conditions 106 that are affecting aircraft model 108 in such a way that an alert alarm was issued. In some embodiments, the one or more messages instruct wind tunnel controller 225 to shut down or deactivate wind tunnel 102.

In some embodiments, WTSHM server 210 includes a low-pass or band-pass filter to filter the plurality of signals received from the plurality of sensors 205. In these embodiments, the signals are filtered before WTSHM server 210 analyzes 615 the plurality of signals. However, when WTSHM server 210 stores data in response to a warning alarm or alert alarm, WTSHM server 210 stores the unfiltered sensor data.

In some further embodiments, WTSHM server 210 combines the data from a plurality of channels to compare to the warning and alert thresholds. For example, WTSHM server 210 may also combine the data from channels A, B, and C to trigger one or more alarms, where the data from each of the channels is below the warning threshold. In still further embodiments, WTSHM server 210 may only monitor combinations of channels for triggering alarms, instead of individual channels.

In some embodiments, WTSHM server 210 compares the combined channels to a factor of safety. The factor of safety represents a buffer of operation before the model is expected to fail. In these embodiments, WTSHM server 210 may receive the factor of safety from the user. For example, the user may determine that the model will fail at a certain point. The user sets the factor of safety to allow WTSHM server 210 to shut down or change operation of the wind tunnel before the model fails.

Figure 7:
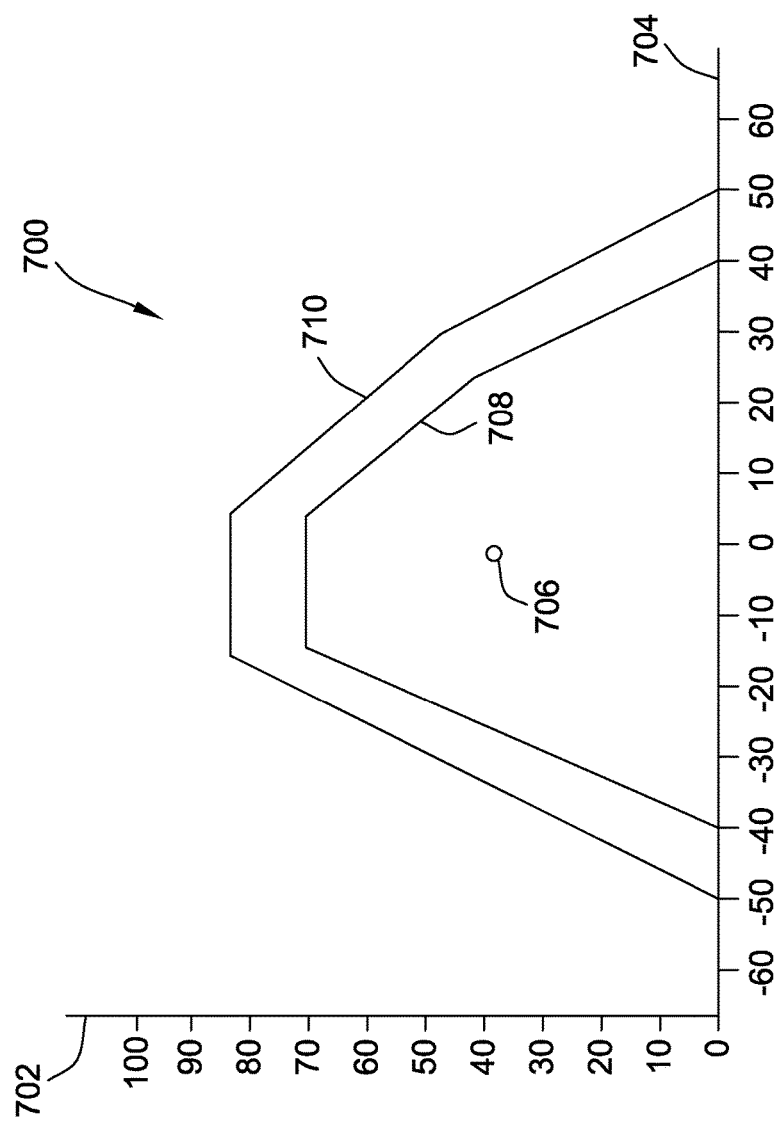
FIG. 7 is illustrates an example graph of a modified Goodman diagram of monitored sensor data from the system shown in FIG. 2 during operation of the wind tunnel environment shown in FIG. 1.

FIG. 7 is illustrates an example graph 700 of a modified Goodman diagram of monitored sensor data from system 200 shown in FIG. 2 during operation of wind tunnel environment 100 shown in FIG. 1. Graph 700 includes a y-axis 702 that represents the dynamic state of a channel or sensor input and an x-axis 704 that represents the steady state of the channel or sensor input.

In the example embodiment, sensors 205 (shown in FIG. 2) measure a plurality of sensor data about aircraft model 108 (shown in FIG. 1). In some embodiments, sensors 205 include strain gauges or accelerometers. By monitoring one of these sensors 205 over time, WTSHM server 210 is able to calculate the change over time (dt) from the received signal. Using dt, WTSHM server 210 determines dynamic and steady states in that signal. WTSHM server 210 maps the dynamic state versus the steady state on graph 700 using indicator 706. Indicator 706 represents the signals from that sensor 205 in real-time.

WTSHM server 210 also calculates warning threshold 708 and alert thresholds 710 for the signal. In some embodiments, these thresholds 708 and 710 are static. In some embodiments, the thresholds 708 and 710 change over time based on conditions 106 in wind tunnel 102 (both shown in FIG. 1). For example, if the angle of attack of model 108 changes, WTSHM server 210 may change thresholds 708 and 710.

When indicator 706 exceeds warning threshold 708, WTSHM server 210 triggers a warning alarm as described above. When indicator 706 exceeds alert threshold 710, WTSHM server 210 triggers an alert alarm as described above. In some embodiments, WTSHM server 210 stores a bookmark on graph 700 for each time indicator 706 exceeded at least one of the thresholds 708 and 710. In these embodiments, WTSHM server 210 stores the bookmark based on the maximum point of indicator 706. In some further embodiments, WTSHM server 210 displays each bookmark on graph 700 to a user.

Figure 8:
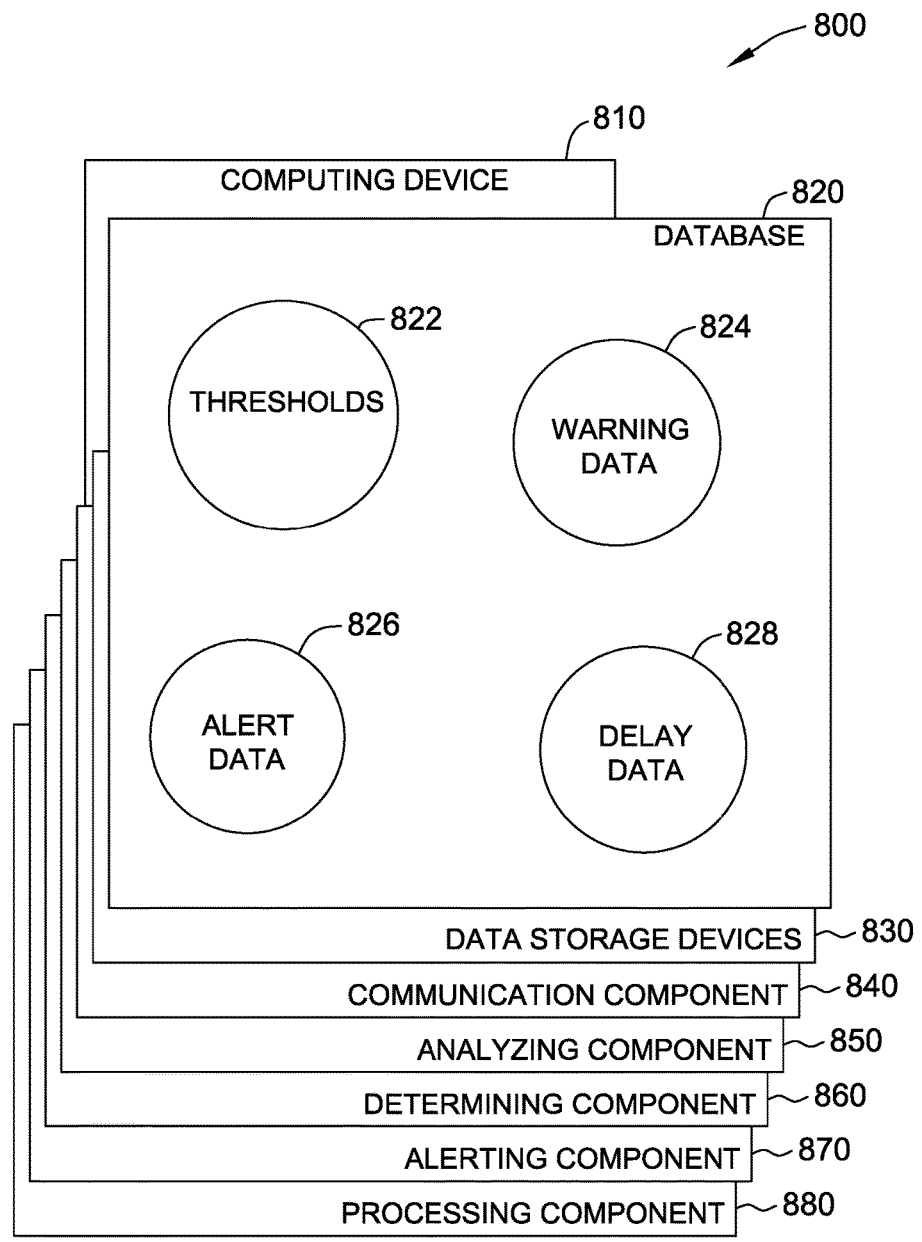
FIG. 8 is a diagram of components of one or more example computing devices that may be used in the system shown in FIG. 2.

FIG. 8 is a diagram 800 of components of one or more example computing devices that may be used in the system 200 shown in FIG. 2. In some embodiments, computing device 810 is similar to WTSHM server 210 (shown in FIG. 2). Database 820 may be coupled with several separate components within computing device 810, which perform specific tasks. In this embodiment, database 820 includes thresholds 822, Warning data 824, Alert data 826, and delay data 828. In some embodiments, database 820 is similar to database 220 (shown in FIG. 2).

Computing device 810 includes the database 820, as well as data storage devices 830. Computing device 810 also includes a communication component 840 for receiving 605 a plurality of signals (shown in FIG. 6). Computing device 810 also includes an analyzing component 850 for analyzing 615 the plurality of signals (shown in FIG. 6). Computer device 810 further includes a determining component 860 for determining 620 that a potentially negative condition is occurring (shown in FIG. 6). Moreover, computer device 810 includes an alerting component 870 for alerting 625 a user (shown in FIG. 6). A processing component 880 assists with execution of computer-executable instructions associated with the system.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

As described above, the implementations described herein relate to systems and methods for wind tunnel operation, and, more specifically, to monitoring and ensuring the safety of a model in a wind tunnel environment. More specifically, a wind tunnel structural health monitor ("WTSHM") computer device provides a communication interface between a plurality of sensors on a model and computer systems that control a wind tunnel. The WTSHM computer device monitors signals from the plurality of sensors, analyzes the sensor data to determine potential issues with operation of the wind tunnel, and controls the conditions generated by the wind tunnel to prevent damage to the model or the wind tunnel.

The above-described methods and systems for wind tunnel operation are cost-effective, secure, and highly reliable. The methods and systems include automatically responding to dangerous conditions, acting on potentially dangerous conditions faster than a human being, and greatly increasing the safety of the operation of a wind tunnel. Accordingly, the methods and systems facilitate safe operation of a wind tunnel in a cost-effective and reliable manner.

This written description uses examples to disclose various implementations, including the best mode, and also to enable any person skilled in the art to practice the various implementations, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system for monitoring a model in a wind tunnel, said system comprising:
   a plurality of sensors attached to a model in a wind tunnel, wherein each sensor of said plurality of sensors is configured to measure an attribute of the model including at least one of strain, stress, lift, weight, drag, and thrust; and
   a computing device in communication with said plurality of sensors, wherein said computing device includes a processor in communication with a memory, wherein said computing device is programmed to:
      receive a plurality of signals from said plurality of sensors, wherein the plurality of signals represent measurements of the attributes of the model;
      store a first threshold and a second threshold based on normalized alarm limits associated with at least one of said plurality of sensors;
      analyze the plurality of signals based, at least in part, on the first threshold and the second threshold;
      determine that the second threshold has been exceeded; and
      transmit one or more messages to instruct the wind tunnel to shut down without user interaction.

2. A system in accordance with claim 1, wherein said computing device is further programmed to:
   determine that the first threshold has been exceeded; and
   initiate a short alarm, wherein the short alarm is at least one of an audible alarm and a visual alarm.

3. A system in accordance with claim 1, wherein said computing device is further programmed to:

determine that the first threshold has been exceeded a predetermined number of times in a first predetermined period of time;
initiate at least one of an audible alarm and a visible alarm; and
store the plurality of signals received for a second predetermined period of time before and after the alarm was initiated, wherein the stored plurality of signals is associated with a warning tag.

4. A system in accordance with claim 1, wherein the first threshold is a distance from the second threshold, and wherein said computing device is further programmed to:
determine that the first threshold has been exceeded by a predetermined portion of the distance between the first threshold and the second threshold;
initiate at least one of an audible alarm and a visible alarm; and
store the plurality of signals received for a second predetermined period of time before and after the alarm was initiated, wherein the stored plurality of signals is associated with a warning tag.

5. A system in accordance with claim 1, wherein said computing device is further programmed to:
initiate at least one of an audible alarm and a visible alarm;
store the plurality of signals received for a second predetermined period of time before and after the alarm was initiated, wherein the stored plurality of signals are associated with an alert tag;
determine one or more changes to conditions in the wind tunnel so that at least the second threshold is no longer exceeded; and
transmit one or more messages to the wind tunnel to implement the one or more changes to the conditions in the wind tunnel without user interaction, so that at least the second threshold is no longer exceeded.

6. A system in accordance with claim 1, wherein said computing device is further programmed to store the plurality of signals received for a second predetermined period of time before and after the alarm was initiated, wherein the stored plurality of signals are associated with an alert tag.

7. A system in accordance with claim 1, wherein said computing device is further programmed to store the first threshold and the second threshold based on one or more user inputs.

8. A system in accordance with claim 1, wherein said computing device is further programmed to:
receive the plurality of signals in a plurality of channels, wherein each channel of the plurality of channels includes signals from one or more sensors of the plurality of sensors; and
store a first threshold and a second threshold associated with each channel of the plurality of channels.

9. A system in accordance with claim 1, wherein the computing device is further programmed to:
calculate a steady state for one sensor of the plurality of sensors;
calculate a dynamic stat for the one sensor;
continually compare the steady state to the dynamic state; and
determine that an operating condition where damage may occur to at least one of the model and the wind tunnel is occurring based on the comparison.

10. A wind tunnel structural health monitor (WTSHM) computer device for monitoring a model in a wind tunnel, said WTSHM computer device comprising a processor in communication with a memory, said processor programmed to:
receive a plurality of signals from a plurality of sensors, wherein each sensor of the plurality of sensors is configured to measure an attribute of a model in the wind tunnel, wherein the plurality of signals represent measurements of the attributes of the model including at least one of strain, stress, lift, weight, drag, and thrust;
store a first threshold and a second threshold based on normalized alarm limits associated with at least one of the plurality of sensors;
analyze the plurality of signals based, at least in part, on the first threshold and the second threshold;
determine that the second threshold has been exceeded;
determine one or more changes to operating conditions in the wind tunnel without making changes to the model so that at least the second threshold is no longer exceeded; and
transmit one or more messages to the wind tunnel to implement the one or more changes to the operating conditions in the wind tunnel without user interaction, so that at least the second threshold is no longer exceeded.

11. A WTSHM computer device in accordance with claim 10, wherein the processor is further programmed to:
determine that the first threshold has been exceeded; and
initiate a short alarm, wherein the short alarm is at least one of an audible alarm and a visual alarm.

12. A WTSHM computer device in accordance with claim 10, wherein the processor is further programmed to:
determine that the first threshold has been exceeded a predetermined number of times in a first predetermined period of time;
initiate at least one of an audible alarm and a visible alarm; and
store the plurality of signals received for a second predetermined period of time before and after the alarm was initiated, wherein the stored plurality of signals is associated with a warning tag.

13. A WTSHM computer device in accordance with claim 10, wherein the first threshold is a distance from the second threshold, and wherein the processor is further programmed to:
determine that the first threshold has been exceeded by a predetermined portion of the distance between the first threshold and the second threshold;
initiate at least one of an audible alarm and a visible alarm; and
store the plurality of signals received for a second predetermined period of time before and after the alarm was initiated, wherein the stored plurality of signals is associated with a warning tag.

14. A WTSHM computer device in accordance with claim 10, wherein the processor is further programmed to:
initiate at least one of an audible alarm and a visible alarm; and
store the plurality of signals received for a second predetermined period of time before and after the alarm was initiated, wherein the stored plurality of signals are associated with an alert tag.

15. A WTSHM computer device in accordance with claim 10, wherein the processor is further programmed to:
initiate at least one of an audible alarm and a visible alarm;

store the plurality of signals received for a second predetermined period of time before and after the alarm was initiated, wherein the stored plurality of signals are associated with an alert tag; and transmit one or more messages to instruct the wind tunnel to shut down without user interaction.

16. A WTSHM computer device in accordance with claim 10, wherein the processor is further programmed to:

receive the plurality of signals in a plurality of channels, wherein each channel of the plurality of channels includes signals from one or more sensors of the plurality of sensors; and store a first threshold and a second threshold associated with each channel of the plurality of channels.

17. A method for monitoring a model in a wind tunnel, said method implemented using a wind tunnel structural health monitor (WTSHM) computer device, said WTSHM computer device comprising a processor in communication with a memory, said method comprising:

receiving a plurality of signals from a plurality of sensors, wherein each sensor of the plurality of sensors is configured to measure an attribute of a model in the wind tunnel, wherein the plurality of signals represent measurements of the attributes of the model including at least one of strain, stress, lift, weight, drag, and thrust;

storing a first threshold and a second threshold based on normalized alarm limits associated with at least one of the plurality of sensors;

analyzing the plurality of signals based, at least in part, on the first threshold and the second threshold;

determining that the second threshold has been exceeded;

determining one or more changes to operating conditions in the wind tunnel without making changes to the model so that at least the second threshold is no longer exceeded; and transmitting one or more messages to the wind tunnel to implement the one or more changes to the operating conditions in the wind tunnel without user interaction, so that at least the second threshold is no longer exceeded.

18. A method in accordance with claim 17 further comprising:

determining that the first threshold has been exceeded a predetermined number of times in a first predetermined period of time;

initiating at least one of an audible alarm and a visible alarm; and storing, in the memory, the plurality of signals received for a second predetermined period of time before and after the alarm was initiated, wherein the stored plurality of signals are associated with a warning tag.

19. A method in accordance with claim 17, wherein the first threshold is a distance from the second threshold, and wherein the method further comprises:

determining that the first threshold has been exceeded by a predetermined portion of the distance between the first threshold and the second threshold;

initiating at least one of an audible alarm and a visible alarm; and storing the plurality of signals received for a second predetermined period of time before and after the alarm was initiated, wherein the stored plurality of signals is associated with a warning tag.

20. A method in accordance with claim 17 further comprising:

initiating at least one of an audible alarm and a visible alarm; and storing the plurality of signals received for a second predetermined period of time before and after the alarm was initiated, wherein the stored plurality of signals are associated with an alert tag.

* * * * *